US012754594B2

(12) United States Patent
Wang et al.

(10) Patent No.: US 12,754,594 B2
(45) Date of Patent: Oct. 6, 2026

(54) POWER DISTRIBUTION DEVICE AND SERVER SYSTEM

(71) Applicants: SQ TECHNOLOGY (SHANGHAI) CORPORATION, Shanghai (CN); INVENTEC CORPORATION, Taipei (TW)

(72) Inventors: Wei Wang, Shanghai (CN); Zhao Geng, Shanghai (CN); Guangzhao Tian, Shanghai (CN); Hong-Chou Lin, Taipei (TW); Yu-Fan Chen, Taipei (TW)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 87 days.

(21) Appl. No.: 18/974,890

(22) Filed: Dec. 10, 2024

(65) Prior Publication Data

US 2026/0072483 A1 Mar. 12, 2026

(30) Foreign Application Priority Data

Sep. 11, 2024 (CN) ........................ 202411275471.3

(51) Int. Cl.

| | |
|---|---|
| ***G06F 1/18*** | (2026.01) |
| ***G06F 1/188*** | (2026.01) |
| ***H05K 7/14*** | (2006.01) |

(52) U.S. Cl.

CPC .............. *G06F 1/189* (2013.01); *G06F 1/181* (2013.01); *G06F 1/188* (2013.01); *H05K 7/1492* (2013.01)

(58) Field of Classification Search

CPC .......... G06F 1/181; G06F 1/188; G06F 1/189; H05K 7/1492

See application file for complete search history.

(56) References Cited

U.S. PATENT DOCUMENTS

| | | | | |
|---|---|---|---|---|
| 9,257,788 | B1 * | 2/2016 | Jia | G06F 1/187 |
| 9,730,357 | B2 * | 8/2017 | Simpson | H05K 7/1492 |
| 2010/0271766 | A1 * | 10/2010 | Lin | G06F 1/184 361/679.48 |
| 2013/0155604 | A1 * | 6/2013 | Lin | G06F 1/187 361/725 |

(Continued)

*Primary Examiner* — Sagar Shrestha

(57) ABSTRACT

A power distribution device and a server system are provided. The power distribution device includes a housing, power distribution assemblies, power distribution connectors, and an AC power connection assembly. An inner cavity of the housing is provided with a plurality of first slots. The power distribution assemblies are provided in the first slots. First plugging structures of the power distribution assemblies cooperatively form a first plugging portion, and the first plugging portion is configured to be plugged and unplugged to the power supply. Second plugging structures of power distribution connectors cooperatively form a second plugging portion, and the second plugging portion is configured to be plugged and unplugged to a middle backplane of a server system. The AC power connection assembly is accommodated in the inner cavity and configured to be externally connected to a high-voltage AC power and electrically connected to the power supply.

10 Claims, 5 Drawing Sheets

(56) References Cited

U.S. PATENT DOCUMENTS

| | | | | |
|---|---|---|---|---|
| 2014/0293523 | A1* | 10/2014 | Jau | H05K 7/1487 361/679.4 |
| 2016/0041590 | A1* | 2/2016 | Yu | G06F 1/1626 361/679.32 |
| 2016/0044820 | A1* | 2/2016 | Xu | H05K 7/20727 361/679.31 |
| 2017/0150621 | A1* | 5/2017 | Breakstone | H05K 7/20736 |
| 2017/0150635 | A1* | 5/2017 | Huang | H05K 7/1492 |
| 2019/0074668 | A1* | 3/2019 | Huang | H05K 7/1492 |

* cited by examiner

POWER DISTRIBUTION DEVICE AND SERVER SYSTEM

CROSS-REFERENCE TO RELATED APPLICATIONS

This application claims priority of Chinese Patent Application No. 202411275471.3, filed on Sep. 11, 2024, entitled "POWER DISTRIBUTION DEVICE AND SERVER SYSTEM", the entire content of which is incorporated herein by reference in its entirety.

TECHNICAL FIELD

The present disclosure relates to relates to the technical field of servers, in particular to a power distribution device and a server system.

BACKGROUND

With the continuous development of artificial intelligence, the energy consumption of servers (such as GPU servers) is getting higher and higher, and the demand for electricity is rising. Among them, a middle backplane of the server not only interconnects high-speed signals in the system, but also connects power supplies between devices. Therefore, the power management of the server is particularly important.

In the related art, the server is generally provided with a plurality of power distribution assemblies to be plugged and cooperate with the middle backplane of the server, so as to satisfy the power demand of the server.

However, in the related art, the power supply mode in which the plurality of power distribution assemblies are plugged and cooperate with the middle backplane has the problems of low space utilization, difficulty in operation and maintenance, and high comprehensive cost.

SUMMARY

Accordingly, it is necessary to provide a power distribution device and a server system to address a problems of low space utilization, difficulty in operation and maintenance, and high comprehensive cost in the power supply mode in which a plurality of power distribution assemblies are plugged into a middle backplane in the related art.

A power distribution device includes: a housing provided with a first jack, a second jack, and a third jack in sequence along the first direction, wherein the housing is provided with an inner cavity, the inner cavity is provided with a plurality of first slots in parallel along a second direction perpendicular to the first direction, and the at least two first slots are in communication with the first jack; a plurality of power distribution assemblies provided in the plurality of first slots, respectively, each power distribution assembly includes a first plugging structure extending through the first jack, and a plurality of first plugging structures cooperatively form a first plugging portion, and the first plugging portion is configured to be plugged and unplugged to a power supply; a plurality of power distribution connectors, wherein each power distribution connector includes a second plugging structure and is accommodated in the inner cavity, each second plugging structure extends through the second jack, and a plurality of second plugging structures cooperatively form a second plugging portion, and the second plugging portion is configured to be plugged and unplugged to a middle backplane of a server system; and an AC power connection assembly accommodated in the inner cavity and extending through the third jack, wherein the AC power connection assembly is configured to be externally connected to a high-voltage AC power and electrically connected to the power supply.

In one of the embodiments, the first jack and the third jack are provided on side walls at both ends of the housing along the first direction, respectively, the housing includes a protrusion structure, and the second jack is provided on a side wall of the protrusion structure away from the third jack along the first direction.

In one of the embodiments, the power distribution device further includes a first handle and a second handle that are connected to a side of the housing adjacent to the third jack, wherein the first handle includes a first grip, a first rotating member, and a first engagement opening, the first rotating member is rotatably connected to the housing, a portion of a computer case of a server is engaged in the first engagement opening, and the first grip is configured to be held to rotate around the first rotating member to push or pull the housing, the second handle includes a second grip, a second rotating member, and a second engagement opening, the second rotating member is rotatably connected to the housing, another portion of the computer case is engaged in the second engagement opening, and the second grip is configured to be held to rotate around the second rotating member to and push or pull the housing.

In one of the embodiments, the first handle further includes a first locking structure, the first handle is configured to rotate around the first rotating member, the first locking structure is configured to lock a relative position between the first handle and the housing when the first handle abuts against on the housing, the second handle further includes a second locking structure, the second handle is configured to rotate around the second rotating member, and the second locking structure is configured to lock a relative position of the second handle and the housing when the second handle abuts against the housing.

In one of the embodiments, the first locking structure includes a first locking nut, and the first locking nut extends through the first grip and is threadedly connected to the housing, so as to lock the first handle to the housing.

In one of the embodiments, the second locking structure includes a second locking nut, and the second locking nut extends through the second handle and is threadedly connected to the housing, so as to lock the second handle to the housing.

In one of the embodiments, the power distribution connector includes a plurality of connection terminals.

A server system is further provided, including the aforementioned power distribution device, a computer case, a middle backplane and a power supply. The middle backplane, and the power supply are accommodated in the computer case, the computer case is provided with a second slot, the power distribution device is capable of being inserted into and removed from the second slot along the first direction, when the power distribution device is inserted into the second slot, a first plugging portion is plugged into the power supply and a second plugging portion is plugged into the middle backplane.

In one of the embodiments, two power distribution devices are provided, the computer case is provided with two second slots, and the two power distribution devices are inserted into the two second slots, respectively.

In one of the embodiments, the computer case is provided with a first engagement block and a second engagement block, a first handle of the power distribution device includes a first grip, a first rotating member, and a first engagement opening, the first rotating member is rotatably connected to the housing, the first engagement block is engaged in the first engagement opening, a second handle of the power distribution device includes a second grip, a second rotating member, and a second engagement opening, the second rotating member is rotatably connected to the housing, the second engagement block is engaged in the second engagement opening, the first grip and the second grip are configured be held and rotate the first handle and the second handle in a clockwise or counterclockwise direction around the first engagement block and the second engagement block, respectively, so that the power distribution device is plugged into or unplugged from the middle backplane and the power supply.

According to the power distribution device and the server system, the plurality of power distribution assemblies are accommodated in the inner cavity of the housing, so that modularization of the power distribution assembly is achieved. On the one hand, modularization management of the power distribution assemblies is facilitated, and the space utilization is improved. On the other hand, the first plugging structures cooperatively form the first plugging portion, which facilitates the plug-in and pull-out operations of the power distribution device in a modular manner and reduces the difficulty and cost of operation and maintenance.

The details of one or more embodiments of the application are set forth in the accompanying drawings and the description below. Other features, objects, and advantages of the application will be apparent from the description and drawings, and from the claims.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DESCRIPTION OF REFERENCE NUMERALS

Figure 1:
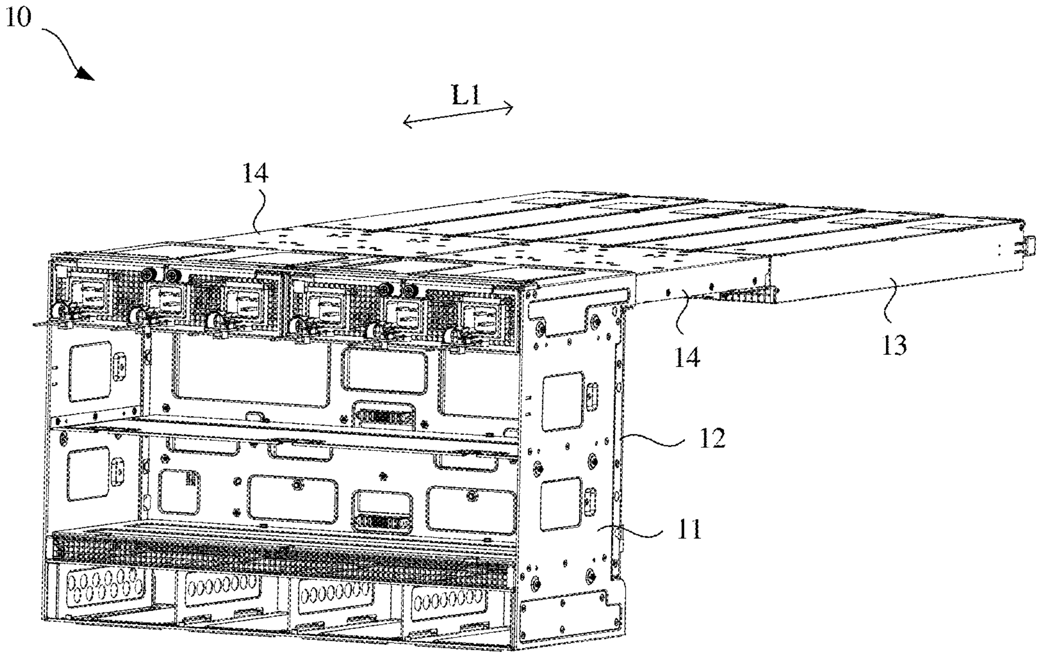
FIG. 1 is a perspective view of a server system according to an embodiment.

10. Server system; 11. Computer case; 11*a*. First engagement block; 11*b*. Second engagement block; 11*c*. Second slot; 12. Middle backplane; 12*a*. Plugging interface; 13. Power supply; 14. Power distribution device; 100. Housing; 100*a*. Inner cavity; 100*b*. First slot; 110. First jack; 120. Second jack; 130. Third jack; 140. Protrusion structure; 200. Power distribution assembly; 210. First plugging structure; 200*a*. First plugging portion; 300. Power distribution connector; 300*a*. Second plugging portion; 310. Second plugging structure; 400. AC power connection assembly; 500. First handle; 510. First grip; 520. First rotating member; 530. First engagement opening; 540. First locking structure; 600. Second handle; 610. Second grip; 620. Second rotating member; 630. Second engagement opening; 640. Second locking structure.

DETAILED DESCRIPTION OF THE EMBODIMENTS

In order to make the above objectives, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms “center”, “longitudinal”, “transverse”, “length”, “width”, “thickness”, “upper”, “lower”, “front”, “rear”, “left”, “right”, “vertical”, “horizontal”, “top”, “bottom”, “inner”, “outer”, “clockwise”, “counterclockwise”, “axial”, “radial”, “circumferential direction” are based on the azimuths or position relationships shown in the attached drawings. These terms are only for the convenience of describing the present disclosure and simplifying the description, rather than indicating or implying that the indicated devices or elements must have the specific azimuths, or be constructed or operated in the specific azimuths, and therefore such terms cannot be understood as limitations of the present disclosure.

In addition, the terms “first” and “second” are only used for descriptive purposes and cannot be understood as indicating or implying relative importance or implicitly indicating the number of indicated technical features. Thus, the features defined with “first” and “second” may explicitly or implicitly include at least one of the features. In the description of the present disclosure, “a plurality of” means at least two, such as two, three, etc., unless otherwise expressly and specifically defined.

In the present disclosure, unless otherwise expressly specified and limited, the terms “mount”, “connect”, “couple”, “fix” and the like should be interpreted broadly. For example, the terms can mean fixed connection, detachable connection, or being integrated. The terms can mean mechanical connection or electrical connection. The terms can mean directly connection or indirectly connection through an intermediate medium. The terms can mean connection within two elements or interaction relationship between two elements, unless otherwise expressly limited. For those skilled in the art, the specific meaning of the above terms in the present disclosure should be understood according to the specific situation.

In the present disclosure, unless otherwise expressly specified and limited, a first feature “above” or “below” a second feature may be in direct contact with the second feature, or the first and second features may be in indirect contact through an intermediate medium. Moreover, the first feature "above" the second feature may be right above or obliquely above the second feature, or the first feature may be merely located at a height higher than the second feature. The first feature "below" the second feature may be right below or obliquely below the second feature, or the first feature may be merely located at a height lower than that of the second feature.

It should be noted that when an element is called "fixed to" or "mounted on" another element, it can be directly on another element or there can be an intermediate element. When an element is considered to be "connected" to another element, it can be directly connected to another element or there can be an intermediate element. The terms "vertical", "horizontal", "up", "down", "left", "right" and similar expressions used herein are for the purpose of illustration only and do not represent the only ways for implementation.

Figure 2:
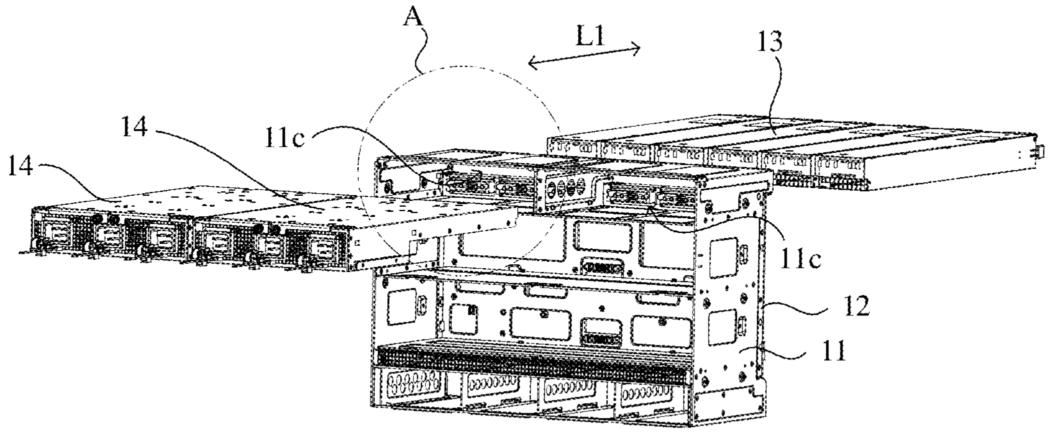
FIG. 2 is an exploded view of the server system of FIG. 1.

Referring to FIG. 1, according to an embodiment, a server system 10 is provided, which includes a computer case 11, a middle backplane 12, a power supply 13, and a power distribution device 14. The middle backplane 12 and the power supply 13 are accommodated in the computer case 11. As shown in FIG. 2, the computer case 11 is provided with a second slot 11*c*. The power distribution device 14 is capable of being inserted into and removed from the second slot 11*c* along a first direction L1. When the power distribution device 14 is inserted into the second slot 11*c*, the power distribution device 14 is plugged into the power supply 13 and the middle backplane 12 to supply power to the server system 10. It should be noted that the first direction L1 refers to a depth direction along the second slot 11*c*, and the first direction L1 also refers to a length direction of the power distribution device 14.

Figure 3:
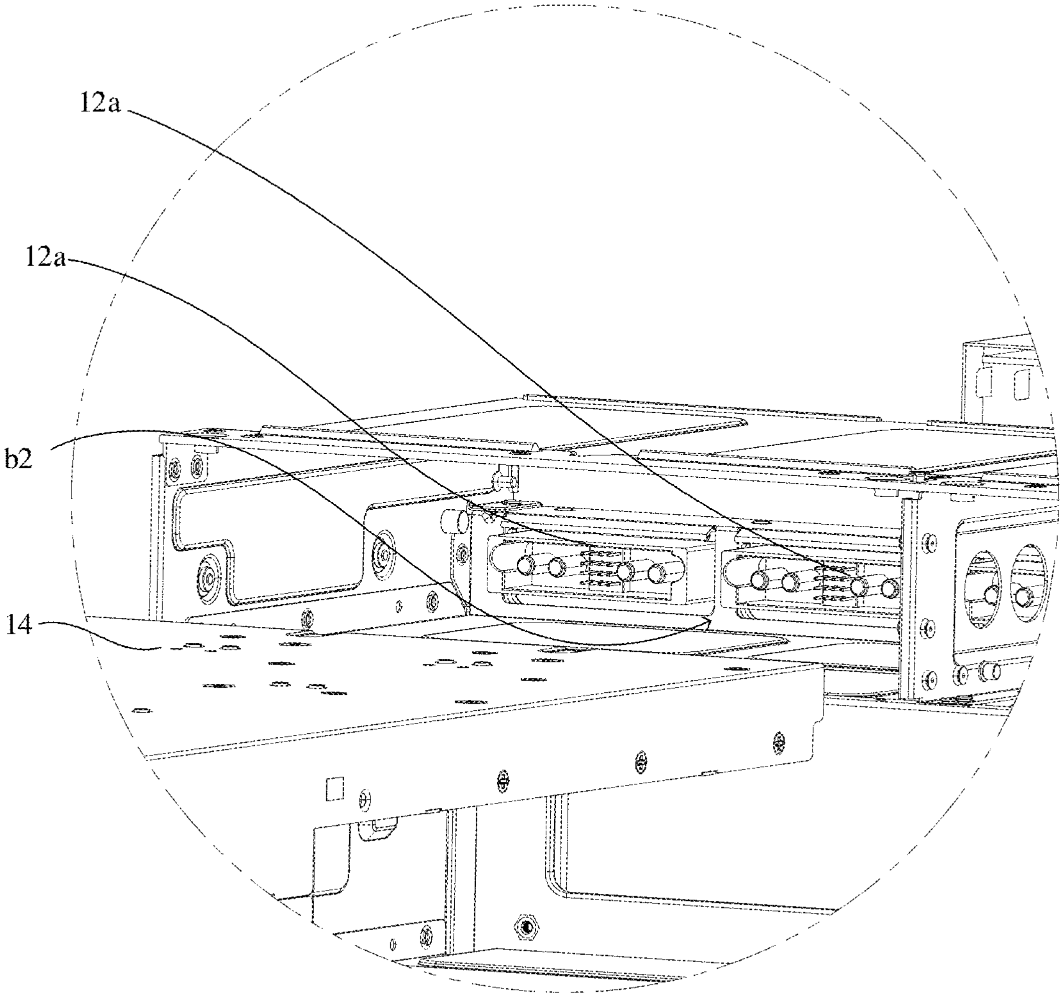
FIG. 3 is an enlarged view of a portion A of FIG. 2.

As shown in FIG. 3, a side of the middle backplane 12 facing the power distribution device 14 is provided with a plugging interface 12*a* configured to be plugged and unplugged with the power distribution device 14.

Specifically, the power distribution device 14 is configured to be externally connect to a high-voltage AC power and input the high-voltage AC power to the server system 10. The power supply 13 is configured to convert the AC power input by the power distribution device 14 into a DC power, and input the DC power to the power distribution device 14. The power distribution device 14 then distributes power according to the received DC power, and outputs the power to the middle backplane 12, so as to supply power to the server system 10.

In order to address the problem of low space utilization, relatively difficult in operation and maintenance, and relatively high comprehensive cost existing in the power supply mode in which a plurality of power distribution assemblies are plugged into the middle backplane 12 in the related art, the power distribution device 14 is provided.

Figure 4:
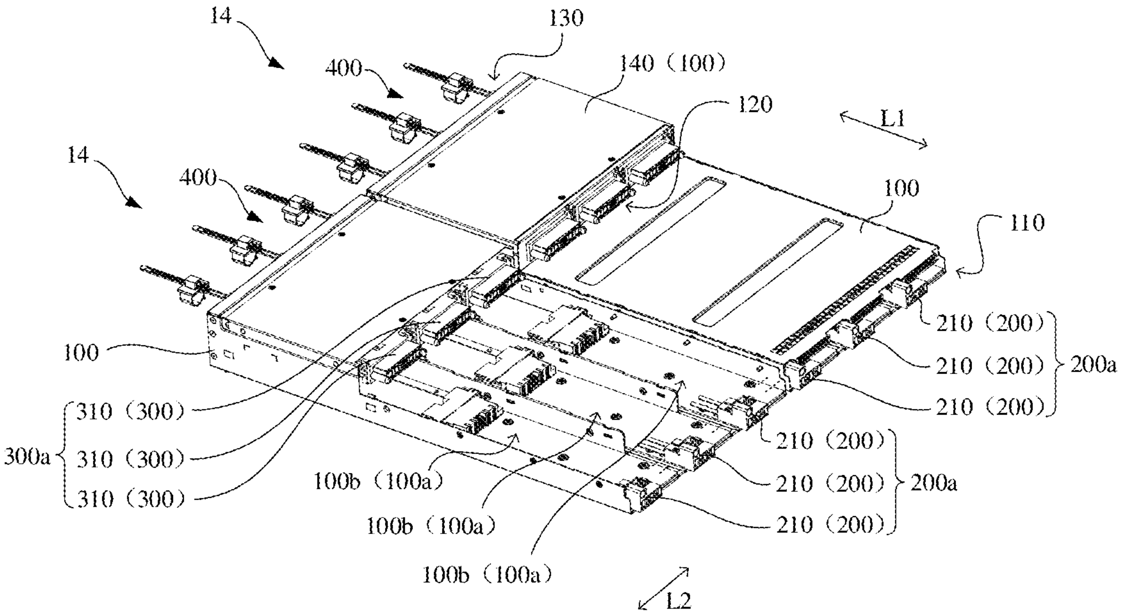
FIG. 4 is a perspective view of a power distribution device according to an embodiment.
Figure 5:
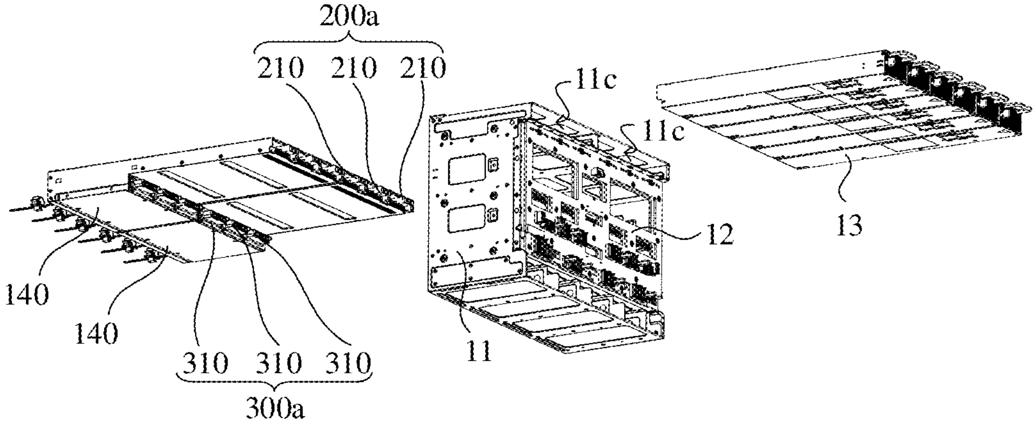
FIG. 5 is similar to FIG. 2, but viewed from another aspect.

As shown in FIG. 4 and FIG. 5, the power distribution device 14 includes a housing 100, a plurality of power distribution assemblies 200, a plurality of power distribution connectors 300, and an AC power connection assembly 400. The housing 100 is provided with a first jack 110, a second jack 120, and a third jack 130 in sequence along the first direction L1, and the housing 100 is provided with an inner cavity 100*a*. The inner cavity 100*a* is provided with a plurality of first slots 100*b* in parallel along a second direction L2 perpendicular to the first direction L1, and the plurality of first slots 100*b* are in communication with the first jack 110.

The number of the power distribution assemblies 200 is the same as the number of the first slots 100*b*, and the plurality of power distribution assemblies 200 are provided in the plurality of first slots 100*b*, respectively. Each power distribution assembly 200 includes a first plugging structure 210 extending through the first jack 110, and a plurality of first plugging structures 210 cooperatively form a first plugging portion 200*a*. The first plugging portion 200*a* is configured to be plugged and unplugged to the power supply 13. The number of power distribution connectors 300 is the same as the number of power distribution assemblies 200.

Each power distribution connector 300 includes a second plugging structure 310 and is accommodated in the inner cavity 100*a*. Each second plugging structure 310 extends through the second jack 120, and a plurality of second plugging structures cooperatively form a second plugging portion 300*a*. The second plugging portion 300*a* is configured to be plugged and unplugged to the plugging interface 12*a* of the middle backplane 12. The AC power connection assembly 400 is accommodated in the inner cavity 100*a* and extends through the third jack 130. The AC connection assembly 400 is configured to be externally connected to the high-voltage AC power and electrically connected to the power supply 13.

In an embodiment, two power distribution devices 14 are provided. It should be noted that FIG. 4 only shows an internal structure of one of the power distribution devices 14, and an internal structure of the other power distribution device 14 is consistent with the internal structure of the aforementioned power distribution device 14, which is not described herein. Further, in FIG. 4, an upper cover structure of the housing 100 of one of the power distribution devices 14 is removed, and the first jack 110 is omitted. It should be noted that the communication between the first slot 100*b* and the first jack 110 means that the first slot 100*b* of the housing 100 is in communication with the first jack 110 of the housing 100 in the same power distribution device 14.

Specifically, when the power distribution device 14 is inserted into the second slot 11*c* of the computer case 11 of the server system 10, the first plugging portion 200*a* is plugged to the power supply 13, and the second plugging portion 300*a* is plugged to the plugging interface 12*a* of the middle backplane 12.

According to the power distribution device 14 and the server system 10 of the aforementioned embodiments, the plurality of power distribution assemblies 200 are accommodated in the inner cavity of the housing 100, so that modularization of the power distribution assembly 200 is achieved. On the one hand, modularization management of the power distribution assemblies 200 is facilitated, and the space utilization is improved. On the other hand, the first plugging structures 210 cooperatively form the first plugging portion 200*a*, which facilitates the plug-in and pull-out operations of the power distribution device 14 in a modular manner and reduces the difficulty and cost of operation and maintenance.

In an embodiment, the number of the first slots 100*b* may be 3, 4, or 5, etc. It should be understood that the number of the power distribution assemblies 200 and the number of the power distribution connectors 300 are each 3, 4, or 5, etc., which is the same as the number of the first slots 100B. The specific number of the power distribution assemblies 200 and the number of power distribution connectors 300 can be determined according to the number of plugging interfaces of the middle backplane 12 and the power supply 13.

In an embodiment, the number of the first slots 100*b* may be three, which helps to satisfy the power consumption while facilitating space utilization.

In an embodiment, the server system 10 includes a plurality of power distribution devices 14. One or more of the power distribution devices 14 can serve as a main power supply assembly, and the rest power distribution devices 14 can serve as a backup power supply assembly, which helps to optimize the power management of the server system 10 and reduce the operation and maintenance cost.

In an embodiment, as shown in FIG. 2, the server system 10 may include two power distribution devices 14, and the computer case 11 is provided with two second slots 11*c*. The two power distribution devices 14 are inserted into the two second slots 11*c*, respectively. One power distribution device 14 may server as the main power supply assembly, and the other power distribution device 14 servers as the backup power supply assembly, which helps to improve the power optimization management and reasonable configuration of the server system 10.

In an embodiment, as shown in FIG. 4, the first jack 110 and the third jack 130 may be, but are not limited to, provided on side walls at both ends of the housing 100 along the first direction L1, respectively. The housing 100 further includes a protrusion structure 140. The second jack 120 is provided on a side wall of the protrusion structure 140 away from the third jack 130 along the first direction L1. It should be noted that when the power distribution device 14 is inserted into the second slot 11*c* of the computer case 11, the power distribution device 14 needs to be inserted into the second slot 11*c* in a direction in which the third jack 130 and the second jack 120 facing the second slot 11*c*.

Specifically, in the embodiment, as shown in FIG. 5, through the design of the protrusion structure 140, when the power distribution device 14 is inserted into the second slot 11*c*, the protrusion structure 140 can abut against the computer case 11 to limit the position, so as to achieve the effects of blind operation and reducing the assembly difficulty, and help to achieve the accurate positioning of the second plugging portion 300*a* and the middle backplane 12, and improve the assembly accuracy. Further, when the protrusion structure 140 is inserted into the second slot 11*c* and abuts against the computer case 11 to limit the position, it helps to make the first plugging portion 200*a* precisely positioned and snap-fit with the power supply 13, thereby further improving assembly accuracy and reducing assembly difficulty.

Figure 6:
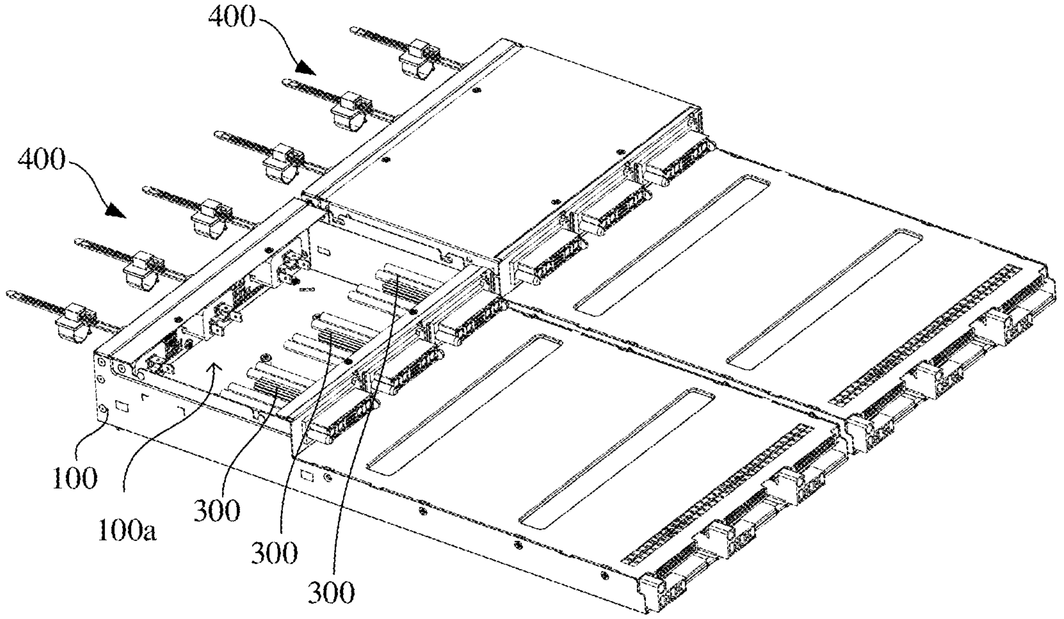
FIG. 6 is perspective view of a power distribution device according to another embodiment.

As shown in FIG. 6, the power distribution connector 300 can be electrically connected to the power distribution assembly 200 through a bending cable. Similarly, the AC power connection assembly 400 may be electrically connected to the power supply 13 through a cable extending through the inner cavity 100*a*, so that the AC power input by the AC power connection assembly 400 can be converted into DC power in the power supply 13 and input to the power distribution assembly 200 for power distribution.

Figure 7:
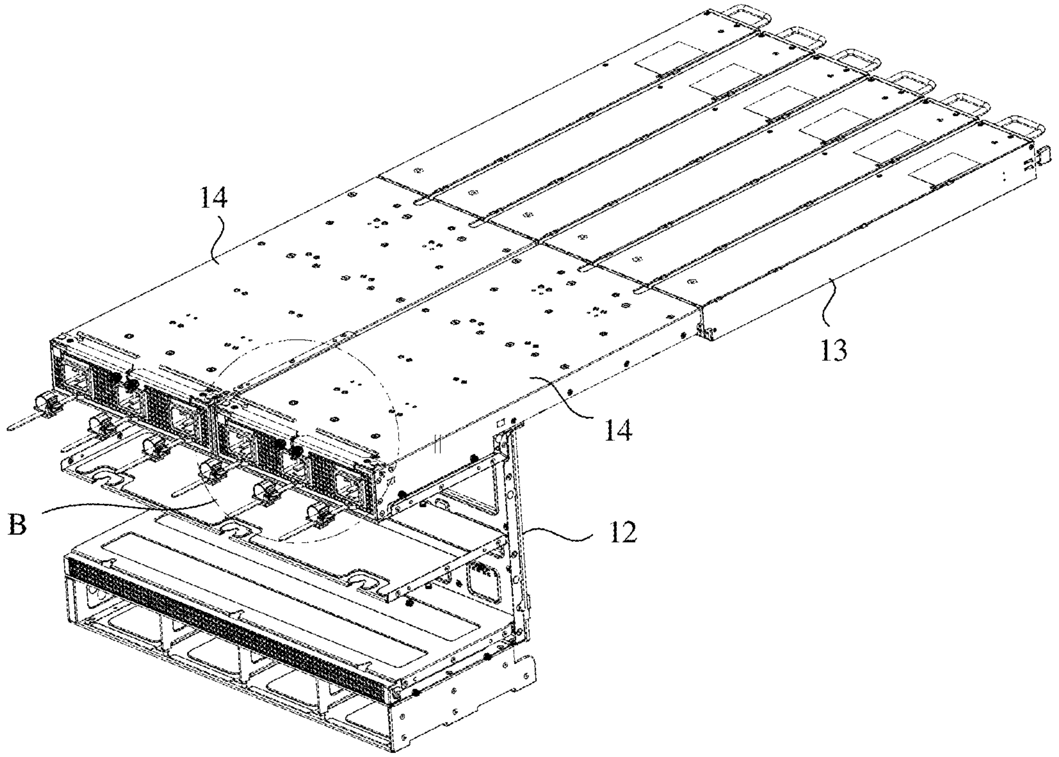
FIG. 7 is similar to FIG. 1, but with a computer case omitted.
Figure 8:
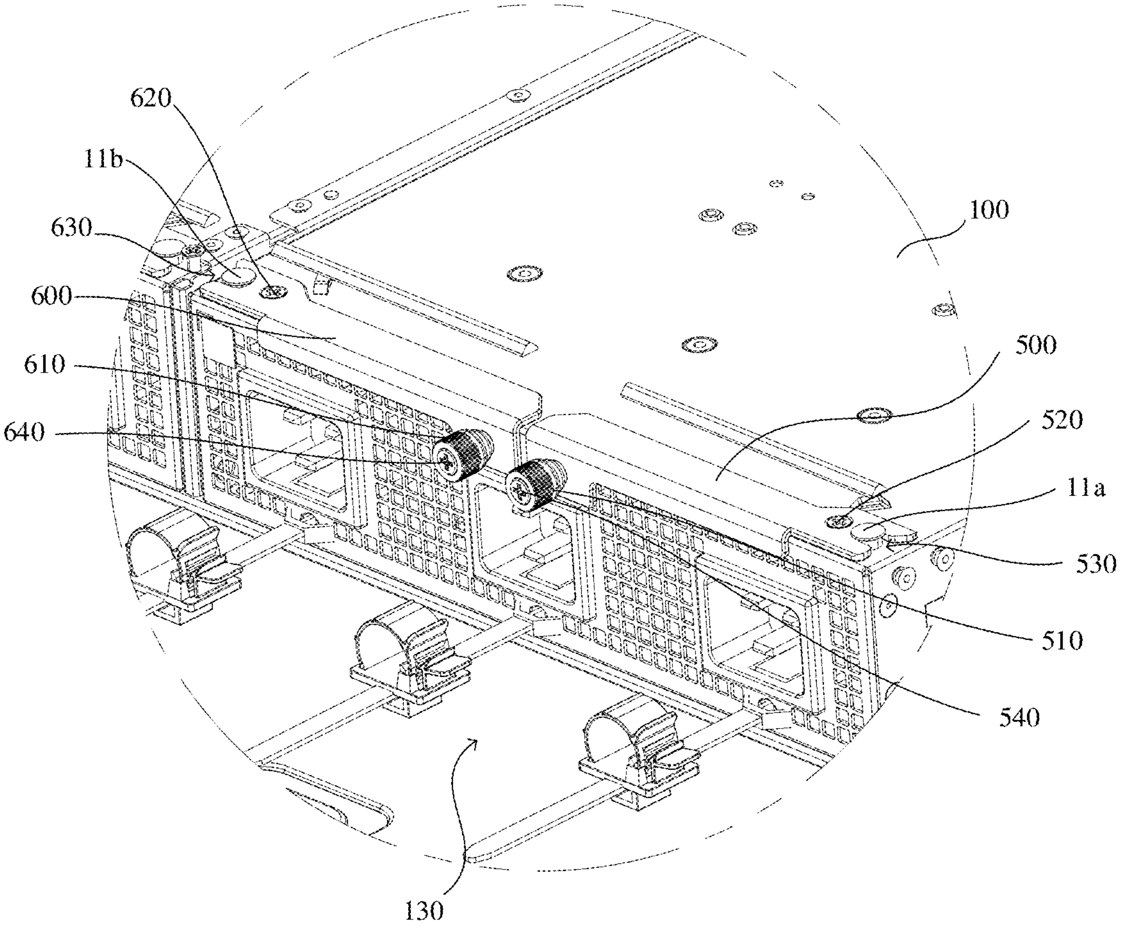
FIG. 8 is an enlarged view of a portion B of FIG. 7.

In an embodiment, referring to FIG. 7 and FIG. 8, the power distribution apparatus 14 may further include a first handle 500 and a second handle 600. The first handle 500 and the second handle 600 are configured to be held to push the power distribution device 14 into the second slot 11*c* or pull the power distribution device 14 out of the second slot 11*c*, which helps to improve the convenience of the assembly the power distribution device 14.

In an embodiment, referring to FIG. 8, the first handle 500 and the second handle 600 may be connected to a side of the housing 100 adjacent to the third jack 130. The first handle 500 may include a first grip 510, a first rotating member 520, and a first engagement opening 530. The first rotating member 520 is rotatably connected to the housing 100. A portion of the computer case 11 is engaged in the first engagement opening 530. The second handle 600 may include a second grip 610, a second rotating member 620, and a second engagement opening 630. The second rotating member 620 is rotatably connected to the housing 100. Another portion of the computer case 11 is engaged in the second engagement opening 630. The first grip 510 is configured to rotate around the first rotating member 520 to push or pull the housing 100. The second grip 610 is configured to be held to rotate around the second rotating member 620 to push or pull the housing 100.

In an embodiment, the computer case 11 may be provided with rotating shaft structures configured to be engaged in the first engagement opening 530 and the second engagement opening 630.

In an embodiment, as shown in FIG. 8, the computer case 11 is provided with a first engagement block 11*a* engaged in the first engagement opening 530 and a second engagement block 11*b* engaged in the second engagement opening 630. The first grip 510 and the second grip 610 are configured be held to rotate around the first engagement block 11*a* and the second engagement block 11*b*, so as to enable the first handle 500 and the second handle 600 to rotate in a clockwise or counterclockwise direction, respectively, so that the power distribution device 14 is plugged into or unplugged from the middle backplane 12 and the power supply 13.

In an embodiment, a distance between the first engagement block 11*a* and the second engagement block 11*b* is the same as a distance between the first engagement opening 530 and the second engagement opening 630, so that the engagement accuracy between the first engagement opening 530 and the first engagement block 11*a* and the engagement accuracy between the second engagement opening 630 and the second engagement block 11*b* can be improved.

Through the first grip 510 and the second grip 610, the holding convenience of the first handle 500 and the second handle 600 is improved. In addition, the first engagement block 11*a* of the server computer case 11 is engaged in the first engagement opening 530, and the second engagement block 11*b* of the server computer case 11 is engaged in the second engagement opening 630, so that the housing 100 can be inserted into or removed from the second slot 11*c* through leverage effect, thereby reducing the insertion and removal resistance and improving the convenience of insertion and removal.

In an embodiment, the first grip 510 and the first engagement opening 530 are provided at two ends of the first handle 500, respectively. The second grip 610 and the second engagement opening 630 are provided at two ends of the second handle 600, respectively, so that the leverage effect can be enhanced to help pushing and pulling the housing 100, thereby improving the convenience of insertion and removal of the power distribution device 14.

In an embodiment, the power distribution connector 300 is a high density power distribution connector including a plurality of connection terminals. Since the power distribution connector 300 includes the plurality of connection terminals, it helps to achieve the power supply requirements of high-power, low-resistance, and low-loss of the server system 10, and helps to improve the stability, reliability, and convenience of the plugging between the power distribution connector 300 and the middle backplane 12.

Since the power distribution connector 300 is a high density power distribution connector, the plugging resistance between the power distribution connector 300 and the middle backplane 12 increases. In the embodiment, in order to reduce the plugging resistance, the first grip 510 is configured to be held to rotate around the first rotating member 520 to push or pull the housing 100, and the second grip 610 is configured to be held to rotate around the second rotating member 620 to push or pull the housing 100, so that the housing 100 can be pushed or pulled under the action of a lever, so that when the power distribution connector 300 includes a plurality of connection terminals, the problem that the plugging resistance between the power distribution connector 300 and the middle backplane 12 is increased can be solved, and the plugging convenience of the power distribution device is improved, thereby reducing the operation and maintenance difficulty and the operation and maintenance cost of the server system 10.

In an embodiment, as shown in FIG. 8, the first handle 500 may include a first locking structure 540. The first handle 500 is configured to rotate around the first rotating member 520 and abut against the housing 100. The first locking structure 540 is configured to lock a relative position between the first handle 500 and the housing 100 when the first handle 500 abuts against the housing 100. The second handle 600 may include a second locking structure 640. The second handle 600 is configured to rotate around the second rotating member 620 and abut against the housing 100. The second locking structure 640 is configured to lock a relative position between the second handle 600 and the housing 100 when the second handle 600 abuts against the housing 100, which helps to fix the first handle 500 and the second handle 600 and prevent them from swinging.

On the other hand, when the relative positions of the first handle 500 and the second handle 600 with respect to the housing 100 are locked, the first handle 500 and the second handle 600 are prevented from rotating with respect to the housing 100, so that the first engagement block 11*a* and the second engagement block 11*b* of the computer case 11 can be firmly engaged in the first engagement opening 530 and the second engagement opening 630, which helps to prevent the housing 100 from moving along the first direction L1 or separating from the second slot 11*c*, thereby improving the safety.

Alternatively, the first locking structure 540 and the second locking structure 640 may be implemented as a lock pin, a lock catch, a lock nut, or the like.

In an embodiment, as shown in FIG. 8, the first locking structure 540 may include a first locking nut. The first locking nut extends through the first grip 510 and is threadedly connected to the housing 100, so as to lock the first handle 500 to the housing 100.

In an embodiment, as shown in FIG. 8, the second locking structure 640 may include a second locking nut. The second locking nut extends through the second handle 610 and is threadedly connected to the housing 100, so as to lock the second handle 600 to the housing 100.

Specifically, in the embodiment, the first lock nut and the second lock nut extend through the first grip 510 and the second grip 610, respectively, so that the volumes of the first handle 500 and the second handle 600 can be reduced, which helps to improve the integration and compactness of the structure. In addition, the first locking nut and the second locking nut are threadedly connected to the housing 100, which helps to improve the locking strength and the fitting degree between the first handle 500 and the housing 100 and between the second handle 600 and the housing 100, thereby improving the engagement strength and the engagement stability between the first engagement opening 530 and the computer case 11 and between the second engagement opening 630 and the computer case 11.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A power distribution device comprising:

a housing provided with a first jack, a second jack, and a third jack in sequence along a first direction, wherein the housing is provided with an inner cavity, the inner cavity is provided with a plurality of first slots in parallel along a second direction perpendicular to the first direction, and the at least two first slots are in communication with the first jack;

a plurality of power distribution assemblies provided in the plurality of first slots, respectively, each power distribution assembly comprises a first plugging structure extending through the first jack, first plugging structures of the plurality of power distribution assemblies cooperatively form a first plugging portion, and the first plugging portion is configured to be plugged and unplugged to a power supply;

a plurality of power distribution connectors, wherein each power distribution connector comprises a second plugging structure and is accommodated in the inner cavity, the second plugging structure extends through the second jack, second plugging structures of the plurality of power distribution connectors cooperatively form a second plugging portion, and the second plugging portion is configured to be plugged and unplugged to a middle backplane of a server system; and an AC power connection assembly accommodated in the inner cavity and extending through the third jack, wherein the AC power connection assembly is configured to be externally connected to a high-voltage AC power and electrically connected to the power supply.

2. The power distribution device according to claim 1, wherein the first jack and the third jack are provided on side walls at both ends of the housing along the first direction, respectively, the housing comprises a protrusion structure, and the second jack is provided on a side wall of the protrusion structure away from the third jack along the first direction.

3. The power distribution device according to claim 2, further comprising a first handle and a second handle that are connected to a side of the housing adjacent to the third jack, wherein the first handle comprises a first grip, a first rotating member, and a first engagement opening, the first rotating member is rotatably connected to the housing, a portion of a computer case of a server is engaged in the first engagement opening, and the first grip is configured to be held to rotate around the first rotating member to push or pull the housing, the second handle comprises a second grip, a second rotating member, and a second engagement opening, the second rotating member is rotatably connected to the housing, another portion of the computer case is engaged in the second engagement opening, and the second grip is configured to be held to rotate around the second rotating member to push or pull the housing.

4. The power distribution device according to claim 3, wherein the first handle further comprises a first locking structure, the first handle is configured to rotate around the first rotating member, the first locking structure is configured to lock a relative position between the first handle and the housing when the first handle abuts against on the housing, the second handle further comprises a second locking structure, the second handle is configured to rotate around the second rotating member, and the second locking structure is configured to lock a relative position of the second handle and the housing when the second handle abuts against the housing.

5. The power distribution device according to claim 4, wherein the first locking structure comprises a first locking nut, and the first locking nut extends through the first grip and is threadedly connected to the housing, so as to lock the first handle to the housing.

6. The power distribution device according to claim 4, wherein the second locking structure comprises a second locking nut, and the second locking nut extends through the second handle and is threadedly connected to the housing, so as to lock the second handle to the housing.

7. The power distribution device according to claim 1, wherein the power distribution connector comprises a plurality of connection terminals.

8. A server system, comprising a power distribution device according to claim 1, a computer case, a middle backplane, and a power supply, wherein the middle backplane and the power supply are accommodated in the computer case, the computer case is provided with a second slot, the power distribution device is capable of being inserted into and removed from the second slot along the first direction, when the power distribution device is inserted into the second slot, a first plugging portion is plugged into the power supply, and a second plugging portion is plugged into the middle backplane.

9. The server system according to claim 8, wherein two power distribution devices are provided, the computer case is provided with two second slots, and the two power distribution devices are inserted into the two second slots, respectively.

10. The server system according to claim 8, wherein the computer case is provided with a first engagement block and a second engagement block, a first handle of the power distribution device comprises a first grip, a first rotating member, and a first engagement opening, the first rotating member is rotatably connected to the housing, the first engagement block is engaged in the first engagement opening;

a second handle of the power distribution device comprises a second grip, a second rotating member, and a second engagement opening, the second rotating member is rotatably connected to the housing, the second engagement block is engaged in the second engagement opening;

the first grip and the second grip are configured be held and rotate the first handle and the second handle in a clockwise or counterclockwise direction around the first engagement block and the second engagement block, respectively, so that the power distribution device is plugged into or unplugged from the middle backplane and the power supply.

* * * * *